(12) United States Patent  
Kakita et al.

(10) Patent No.: US 11,664,784 B2  
(45) Date of Patent: May 30, 2023

(54) ACOUSTIC WAVE DEVICE, FILTER, AND MULTIPLEXER

(71) Applicant: TAIYO YUDEN CO., LTD., Tokyo (JP)

(72) Inventors: Naoki Kakita, Tokyo (JP); Hitoshi Tsukidate, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 399 days.

(21) Appl. No.: 16/903,247

(22) Filed: Jun. 16, 2020

(65) Prior Publication Data

US 2021/0006231 A1 Jan. 7, 2021

(30) Foreign Application Priority Data

Jul. 4, 2019 (JP) .............................. JP2019-125460

(51) Int. Cl.
   *H03H 9/25* (2006.01)
   *H03H 9/02* (2006.01)
   *H01L 41/312* (2013.01)

(52) U.S. Cl.
   CPC ............. *H03H 9/25* (2013.01); *H01L 41/312* (2013.01); *H03H 9/02574* (2013.01)

(58) Field of Classification Search
   None
   See application file for complete search history.

(56) References Cited

U.S. PATENT DOCUMENTS

| 2014/0117815 | A1* | 5/2014 | Bl | H03H 3/04 |
| | | | | 310/346 |
| 2016/0380176 | A1* | 12/2016 | Kishino | H03H 9/725 |
| | | | | 370/282 |
| 2017/0063339 | A1* | 3/2017 | Burak | H03H 9/02574 |
| 2019/0288661 | A1 | 9/2019 | Akiyama et al. | H03H 9/02614 |

FOREIGN PATENT DOCUMENTS

JP 2018-61258 A 4/2018

* cited by examiner

*Primary Examiner* — Erica S Lin  
(74) *Attorney, Agent, or Firm* — Stein IP, LLC

(57) ABSTRACT

An acoustic wave device includes: a piezoelectric substrate bonded on a support substrate, a surface including protruding portions and/or recessed portions being interposed between the piezoelectric substrate and the support substrate; a first acoustic wave resonator that includes first electrode fingers with a first average pitch and is disposed on the piezoelectric substrate in a first region where an average interval between the protruding portions and/or the recessed portions in a direction in which the first electrode fingers are arranged is a first interval; and a second acoustic wave resonator that includes second electrode fingers with a second average pitch different from the first average pitch, and is disposed on the piezoelectric substrate in a second region where an average interval between the protruding portions and/or the recessed portions in a direction in which the second electrode fingers are arranged is a second interval different from the first interval.

11 Claims, 10 Drawing Sheets

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2019-125460, filed on Jul. 4, 2019, the entire contents of which are incorporated herein by reference.

FIELD

A certain aspect of the embodiments relates to an acoustic wave device, a filter, and a multiplexer.

BACKGROUND

Surface acoustic wave resonators are known as acoustic wave resonators used in communication devices such as smartphones. It is known to bond a piezoelectric substrate on which a surface acoustic wave resonator is to be formed to a support substrate. It is known to roughen the upper surface of the support substrate as disclosed in, for example, Japanese Patent Application Publication No. 2018-61258 (hereinafter, referred to as Patent Document 1).

SUMMARY OF THE INVENTION

According to a first aspect of the embodiments, there is provided an acoustic wave device including: a support substrate; a piezoelectric substrate directly or indirectly bonded on the support substrate, a surface including protruding portions and/or recessed portions being interposed between the piezoelectric substrate and the support substrate; a first acoustic wave resonator including first electrode fingers, an average pitch of the first electrode fingers being a first pitch, the first acoustic wave resonator being disposed on the piezoelectric substrate in a first region where an average interval between the protruding portions and/or the recessed portions in a direction in which the first electrode fingers are arranged is a first interval; and a second acoustic wave resonator including second electrode fingers, an average pitch of the second electrode fingers being a second pitch, the second pitch being different from the first pitch, the second acoustic wave resonator being disposed on the piezoelectric substrate in a second region where an average interval between the protruding portions and/or the recessed portions in a direction in which the second electrode fingers are arranged is a second interval, the second interval being different from the first interval.

According to a second aspect of the embodiments, there is provided a filter including the above acoustic wave device.

According to a third aspect of the embodiments, there is provided a filter including the above acoustic wave resonator, wherein the first pitch is less than the second pitch, the first interval is less than the second interval, the first acoustic wave resonator is a series resonator connected in series between a first terminal and a second terminal, and the second acoustic wave resonator is a parallel resonator connected in parallel between the first terminal and the second terminal.

According to a fourth aspect of the embodiments, there is provided a multiplexer including the above filter.

DETAILED DESCRIPTION

Spurious emissions are reduced by roughening the upper surface of the support substrate as in Patent Document 1. However, when acoustic wave resonators having different resonant frequencies are provided as in the ladder-type filter, the arrangement of recesses and protrusions of the rough surface effective to reduce spurious emissions of the acoustic wave resonators is not known.

Hereinafter, embodiments will be described with reference to the accompanying drawings.

First Embodiment

Figure 1A:
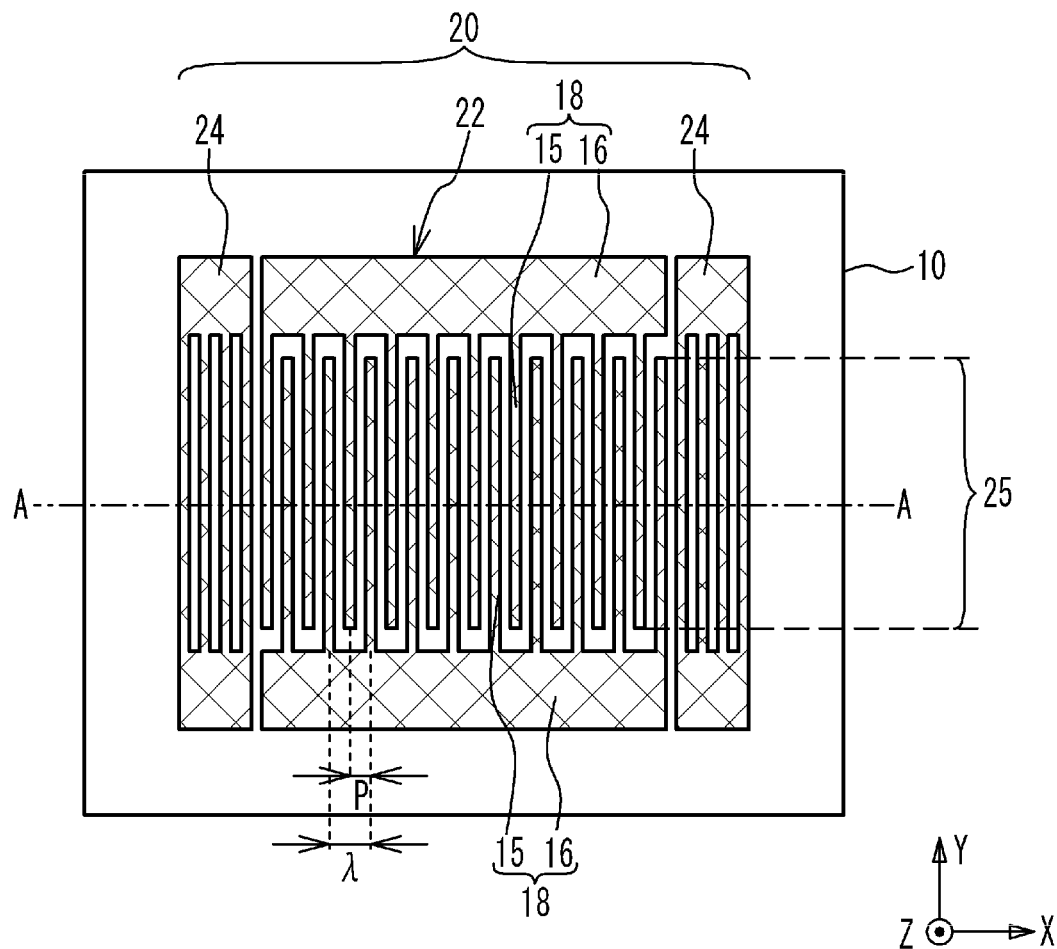
FIG. 1A is a plan view of an acoustic wave resonator in a first embodiment.
Figure 1B:
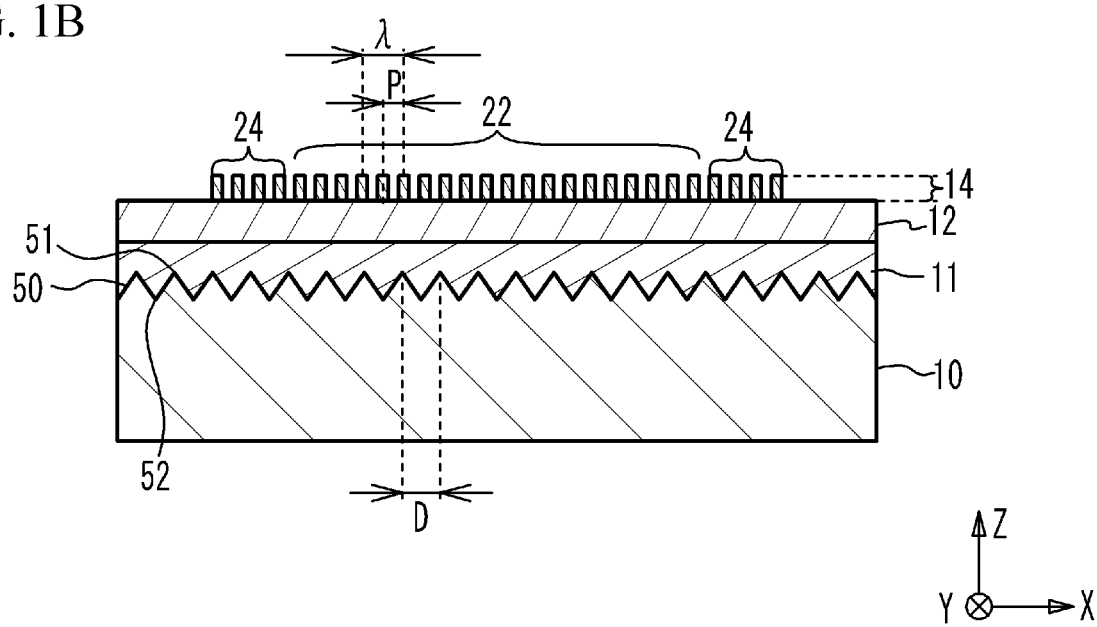
FIG. 1B is a cross-sectional view taken along line A-A in FIG. 1A.

FIG. 1A is a plan view of an acoustic wave resonator in a first embodiment, and FIG. 1B is a cross-sectional view taken along line A-A in FIG. 1A. The direction in which electrode fingers are arranged is defined as an X direction, the direction in which the electrode fingers extend is defined as a Y direction, and the direction in which a support substrate and a piezoelectric substrate are stacked is defined as a Z direction. The X direction, the Y direction, and the Z direction do not necessarily correspond to the X-axis orientation and the Y-axis orientation of the crystal orientation of the piezoelectric substrate. When the piezoelectric substrate is a rotated Y-cut X-propagation substrate, the X direction is the X-axis orientation of the crystal orientation.

As illustrated in FIG. 1A and FIG. 1B, an insulating layer 11 is disposed on a support substrate 10. An interface 50 between the support substrate 10 and the insulating layer 11 is a rough surface, and includes protruding portions 51 and recessed portions 52. The protruding portions 51 and the recessed portions 52 are arranged at substantially constant intervals D. A piezoelectric substrate 12 is disposed on the insulating layer 11. An acoustic wave resonator 20 is disposed on the piezoelectric substrate 12. The acoustic wave resonator 20 includes an inter digital transducer (IDT) 22 and reflectors 24. The reflectors 24 are disposed at both sides of the IDT 22 in the X direction. The IDT 22 and the reflectors 24 are formed of a metal film 14 on the piezoelectric substrate 12.

The IDT 22 includes a pair of comb-shaped electrodes 18 facing each other. The comb-shaped electrode 18 includes electrode fingers 15 and a bus bar 16 to which the electrode fingers 15 are coupled. The region where the electrode fingers 15 of the pair of the comb-shaped electrodes 18 overlap with each other is an overlap region 25. The length of the overlap region 25 is an aperture length. The pair of the comb-shaped electrodes 18 is arranged opposite to each other such that the electrode fingers 15 of one of the comb-shaped electrodes 18 and the electrode fingers 15 of the other of the comb-shaped electrodes 18 are substantially alternately arranged in at least a part of the overlap region 25. The acoustic wave excited by the electrode fingers 15 in the overlap region 25 propagates mainly in the X direction. The pitch of the electrode fingers 15 of one of the pair of the comb-shaped electrodes 18 is the wavelength λ. That is, the wavelength λ of the acoustic wave is substantially two times the pitch P of the electrode fingers 15. The reflectors 24 reflect the acoustic wave (the surface acoustic wave) excited by the electrode fingers 15 of the IDT 22. Thus, the acoustic wave is confined in the overlap region 25 of the IDT 22.

The piezoelectric substrate 12 is a monocrystalline lithium tantalate (LiTaO$_3$) substrate, a monocrystalline lithium niobate (LiNbO$_3$) substrate, or a monocrystalline crystal substrate, and is, for example, a rotated Y-cut X-propagation lithium tantalate substrate or a rotated Y-cut X-propagation lithium niobate substrate. The insulating layer 11 is, for example, an amorphous and/or polycrystalline layer mainly composed of silicon oxide (SiO$_2$). The insulating layer 11 may be mainly composed of silicon oxide, and contain impurities such as fluorine. The temperature coefficient of the elastic constant of the insulating layer 11 is opposite in sign to the temperature coefficient of the elastic constant of the piezoelectric substrate 12. Accordingly, the temperature coefficient of frequency of the acoustic wave resonator can be made to be small.

The support substrate 10 has a linear expansion coefficient in the X direction less than that of the piezoelectric substrate 12. This reduces the temperature coefficient of frequency of the acoustic wave resonator. The support substrate 10 is, for example, a sapphire substrate, an alumina substrate, a silicon substrate, or a silicon carbide substrate. The sapphire substrate is a monocrystalline aluminum oxide (Al$_2$O$_3$) substrate having an r-plane, a c-plane, or an a-plane as the upper surface. The alumina substrate is a polycrystalline aluminum oxide (Al$_2$O$_3$) substrate. The silicon substrate is a monocrystalline or polycrystalline silicon (Si) substrate. The silicon carbide substrate is a monocrystalline or polycrystalline silicon carbide (SiC) substrate.

A bonding layer for bonding the piezoelectric substrate 12 and the insulating layer 11 by surface activation may be interposed between the piezoelectric substrate 12 and the insulating layer 11. The bonding layer is, for example, an aluminum oxide layer, an aluminum nitride layer, a diamond-like carbon layer, a silicon carbide layer, a silicon nitride layer, or a silicon layer. The bonding layer has a thickness of, for example, 1 nm to 100 nm.

The metal film 14 is a film mainly composed of, for example, aluminum (Al), copper (Cu), or molybdenum (Mo), and is, for example, an aluminum film, a copper film, or a molybdenum film. An adhesion film such as a Ti (titanium) film or a Cr (chrome) film may be interposed between the electrode fingers 15 and the piezoelectric substrate 12. The adhesion film is thinner than the electrode finger 15. An insulating film may be disposed to cover the electrode finger 15. The insulating film functions as a protective film or a temperature compensation layer.

The thickness of the support substrate 10 is, for example, 50 μm to 500 μm. The thickness of the insulating layer 11 is, for example, 0.1 μm to 10 μm, and is equal to or less than, for example, the wavelength λ of the acoustic wave. The thickness of the piezoelectric substrate 12 is, for example, 0.1 μm to 20 μm, and is equal to or less than, for example, the wavelength λ of the acoustic wave. The wavelength λ of the acoustic wave is, for example, 1 μm to 6 μm. When two electrode fingers 15 are defined as a pair, the number of pairs of the electrode fingers 15 is, for example, 20 pairs to 300 pairs. The duty ratio of the IDT 22 is the width of the electrode finger 15/the pitch of the electrode fingers 15, and is, for example, 30% to 80%. The aperture length of the IDT 22 is, for example, 10λ to 50λ.

Simulation

Figure 2:
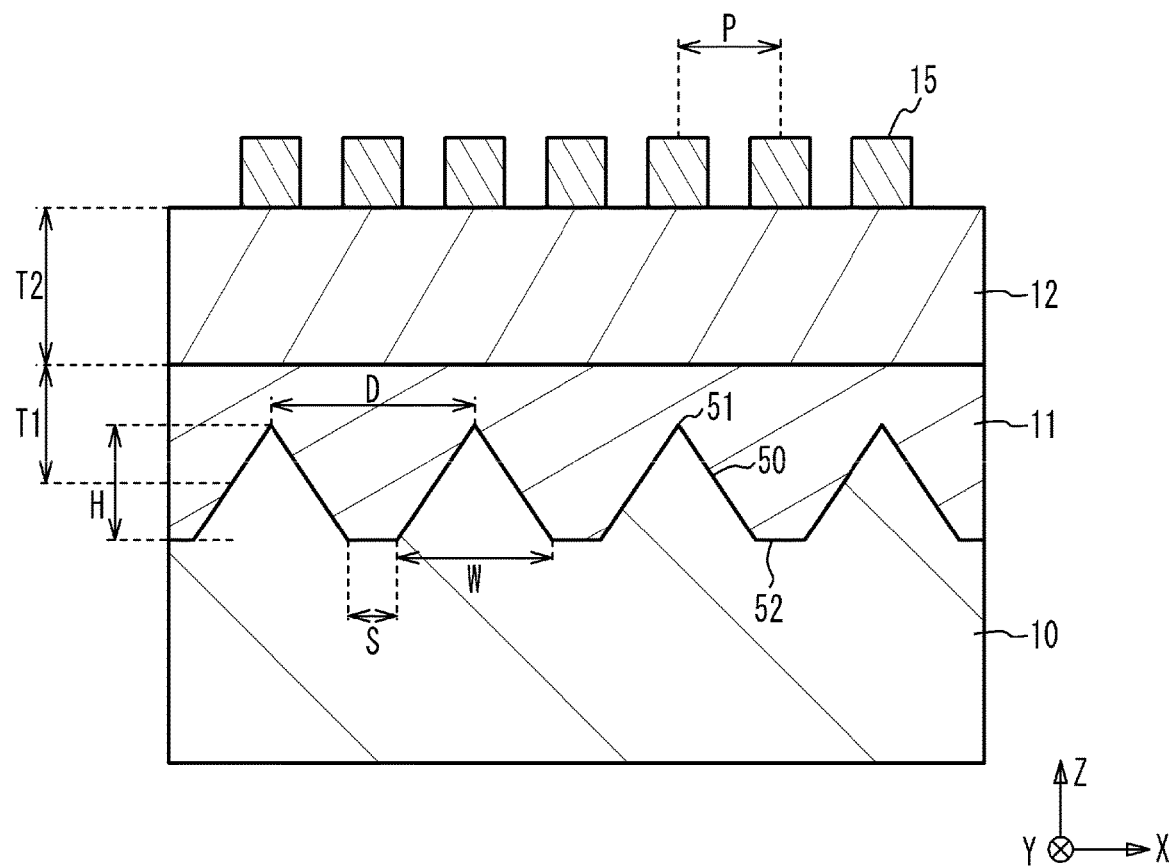
FIG. 2 is a cross-sectional view of an acoustic wave resonator used for simulation.

The magnitude of the spurious emission was simulated by varying the interval between the protruding portions 51 and the heights of the protruding portions 51. FIG. 2 is a cross-sectional view of an acoustic wave resonator used for simulation. As illustrated in FIG. 2, it was assumed that the cross-section of the protruding portion 51 had a triangular shape, and the protruding portions 51 were disposed on a plane. The pitch of the electrode fingers 15 was denoted by P, the interval between the protruding portions 51 was denoted by D, the width of the space between the protruding portion 51 on the bottom face was denoted by S, and the width of the bottom face of the protruding portion 51 was denoted by W. The height of the protruding portion 51 was denoted by H. The average thickness of the insulating layer 11 was denoted by T1, and the thickness of the piezoelectric substrate 12 was denoted by T2. The average thickness T1 of the insulating layer 11 can be calculated from the volume per unit area in plan view of the insulating layer 11.

The simulation conditions are as follows.

Support substrate 10: C-plane sapphire substrate

Insulating layer 11: Silicon oxide layer with an average thickness T1 of 2.0 μm

Piezoelectric substrate 12: 42° Y-cut X-propagation lithium tantalate substrate with a thickness T2 of 2.0 μm Metal film 14: Aluminum film with a thickness of 500 nm Space S between the protruding portions 51: 0.3 μm Height H of the protruding portion 51: 0.5, 1.0, 1.65, and 2.0 μm Interval D between the protruding portions 51: 2, 3, 4, 6, and 8 μm Pitch P of the electrode fingers 15×2 (the wavelength λ of the acoustic wave): 4, 5, and 6 μm Performed was a 2.5 dimensional simulation in which the boundary condition in the X direction was set as the periodic boundary condition, the width in the Y direction was set at λ/32, and the boundary condition in the Y direction was set as the periodic boundary condition. The number of pairs of the electrode fingers 15 was set at the smallest number of pairs with which the electrode fingers 15 and the protruding portions 51 have periodic structures. When the smallest number of pairs is 3 pairs or less, the number of pairs was set at 3 pairs. The admittance of the spurious emission was converted to the admittance under the condition that the number of pairs was 100 pairs and the aperture length was 25λ.

Figure 3A:
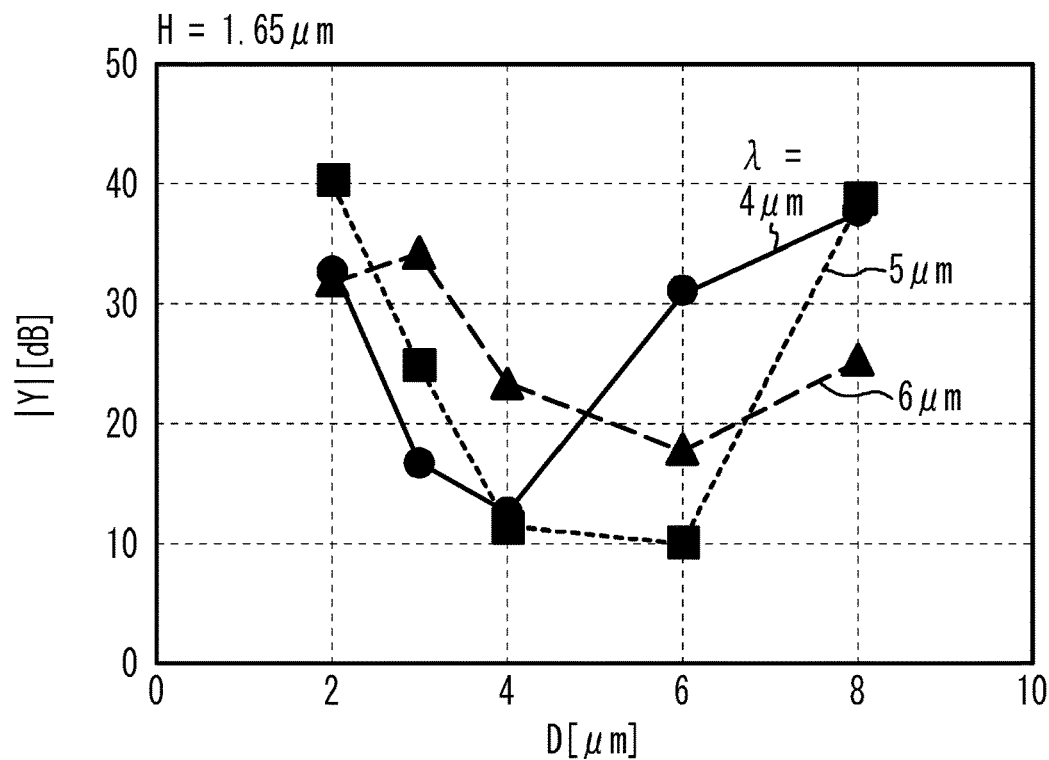
FIG. 3A and FIG. 3B illustrate simulation results.
Figure 3B:
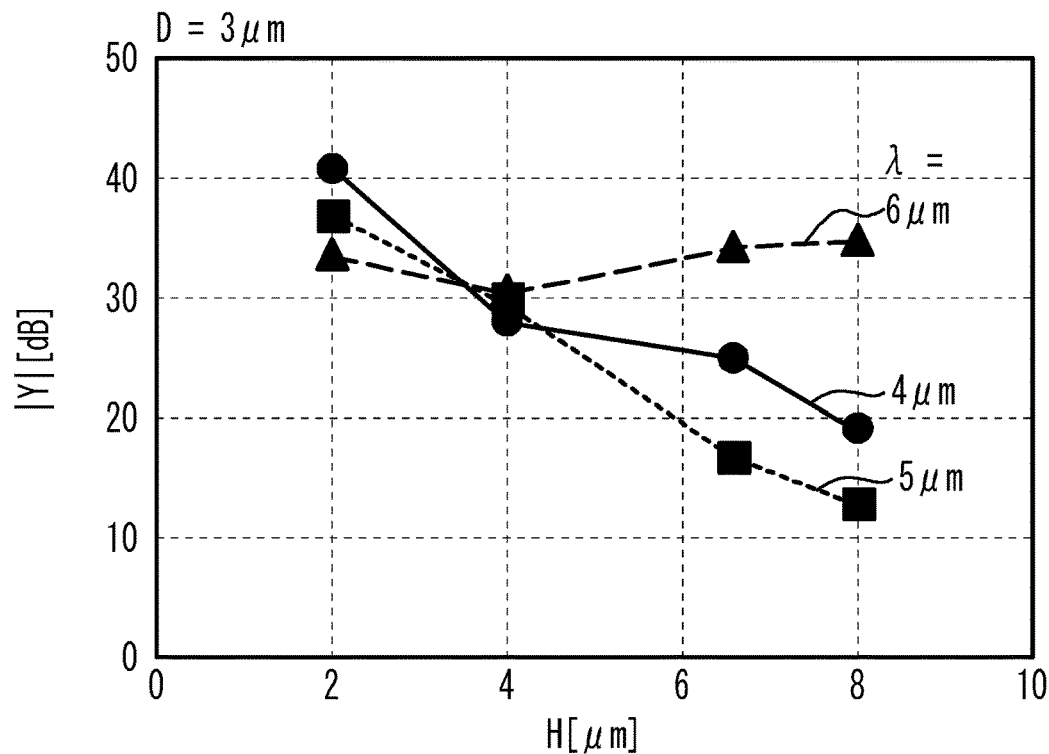

FIG. 3A and FIG. 3B illustrate simulation results. FIG. 3A is a graph of the magnitude |Y| of the admittance of the spurious emission versus the interval D between the protruding portions 51 under the condition that the height H of the protruding portion 51 is 1.65 μm and λ is 4, 5, and 6 μm. As illustrated in FIG. 3A, when k=4, 5, and 6 μm, the spurious emission is smallest at the interval D of approximately 4, 5, and 6 μm. When the interval D becomes greater than or less than λ by 2 μm or greater, the spurious emission becomes larger. As described above, the spurious emission is smallest when the interval D in the X direction between the protruding portions 51 is substantially equal to the wavelength λ of the acoustic wave excited by the electrode fingers 15 (i.e., the pitch P in the X direction of the electrode fingers 15×2). To reduce spurious emissions, the interval D is preferably equal to or greater than 1.2 times the pitch P and equal to or less than 2.8 times the pitch P, more preferably equal to or greater than 1.6 times the pitch P and equal to or less than 2.4 times the pitch P, further preferably equal to or greater than 1.8 times the pitch P and equal to or less than 2.2 times the pitch P.

FIG. 3B is a graph of the magnitude |Y| of the admittance of the spurious emission versus the height H of the protruding portion 51 when λ=4, 5, and 6 μm and the interval D between the protruding portions 51 is 3.0 μm. As illustrated in FIG. 3B, when λ=4 μm and 5 μm, as the height H increases, the spurious emission becomes smaller. When λ=6 the magnitude of the spurious emission does not change so much even when the height H increases. As illustrated in FIG. 3A, the spurious emission is not reduced so much when λ=6 μm and D=3.0 μm. Thus, it is considered that the effect in reducing spurious emissions is small even when the height H is increased. When λ=4 μm and 5 μm, it is considered that spurious emissions are reduced by making the height H equal to or greater than 0.1 times λ (i.e., equal to or greater than 0.2 times the pitch P) in the interval D at which the effect in reducing spurious emissions is large. The height H is preferably equal to or greater than 0.4 times the pitch P. As the height H increases, it becomes difficult to decrease the interval D. Thus, the height H is preferably equal to or less than 1 time the pitch P.

A description will be given of a first embodiment based on the above simulation results by taking a ladder-type filter as an example of an acoustic wave device.

Figure 4A:
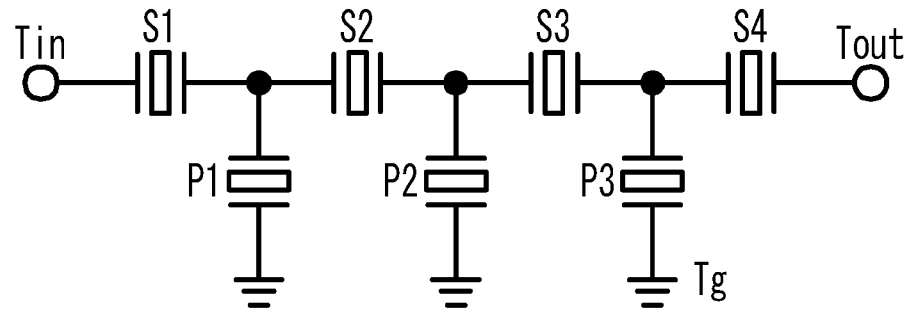
FIG. 4A is a circuit diagram of a ladder-type filter in accordance with the first embodiment, and FIG. 4B schematically illustrates the transmission characteristic of the ladder-type filter.
Figure 4B:
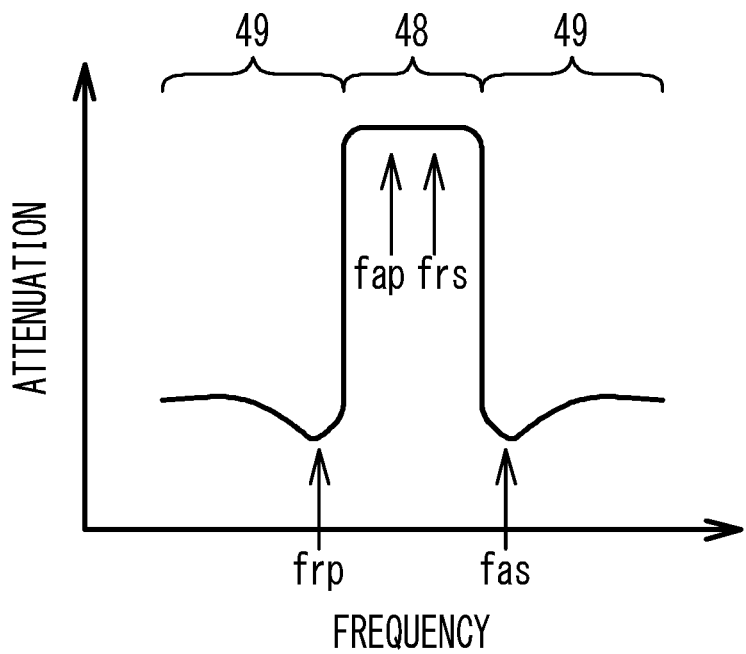

FIG. 4A is a circuit diagram of a ladder-type filter in accordance with the first embodiment, and FIG. 4B schematically illustrates the transmission characteristic of the ladder-type filter. As illustrated in FIG. 4A, the ladder-type filter includes series resonators S1 to S4 and parallel resonators P1 to P3. The series resonators S1 to S4 are connected in series between an input terminal Tin (a first terminal) and an output terminal Tout (a second terminal). The parallel resonators P1 to P3 are connected in parallel between the input terminal Tin and the output terminal Tout. First ends of the parallel resonators P1 to P3 are coupled to ground terminals Tg. The number of series resonators and the number of parallel resonators can be freely selected.

As illustrated in FIG. 4B, the ladder-type filter functions as a bandpass filter having a passband 48 and a stopband 49. The resonant frequencies frs of the series resonators S1 to S4 are positioned in the middle part of the passband 48, and the antiresonant frequencies fas of the series resonators S1 to S4 are positioned in the stopband 49 higher than the passband 48. The antiresonant frequencies fap of the parallel resonators P1 to P3 are positioned in the middle part of the passband 48, and the resonant frequencies frp of the parallel resonators P1 to P3 are positioned in the stopband 49 lower than the passband 48. The high frequency end of the passband 48 is determined by the antiresonant frequencies fas of the series resonators S1 to S4, and the low frequency end of the passband 48 is determined by the resonant frequencies frp of the parallel resonators P1 to P3. As seen above, in the ladder-type filter, the resonant frequencies of the series resonators S1 to S4 differ from the resonant frequencies of the parallel resonators P1 to P3.

Figure 5:
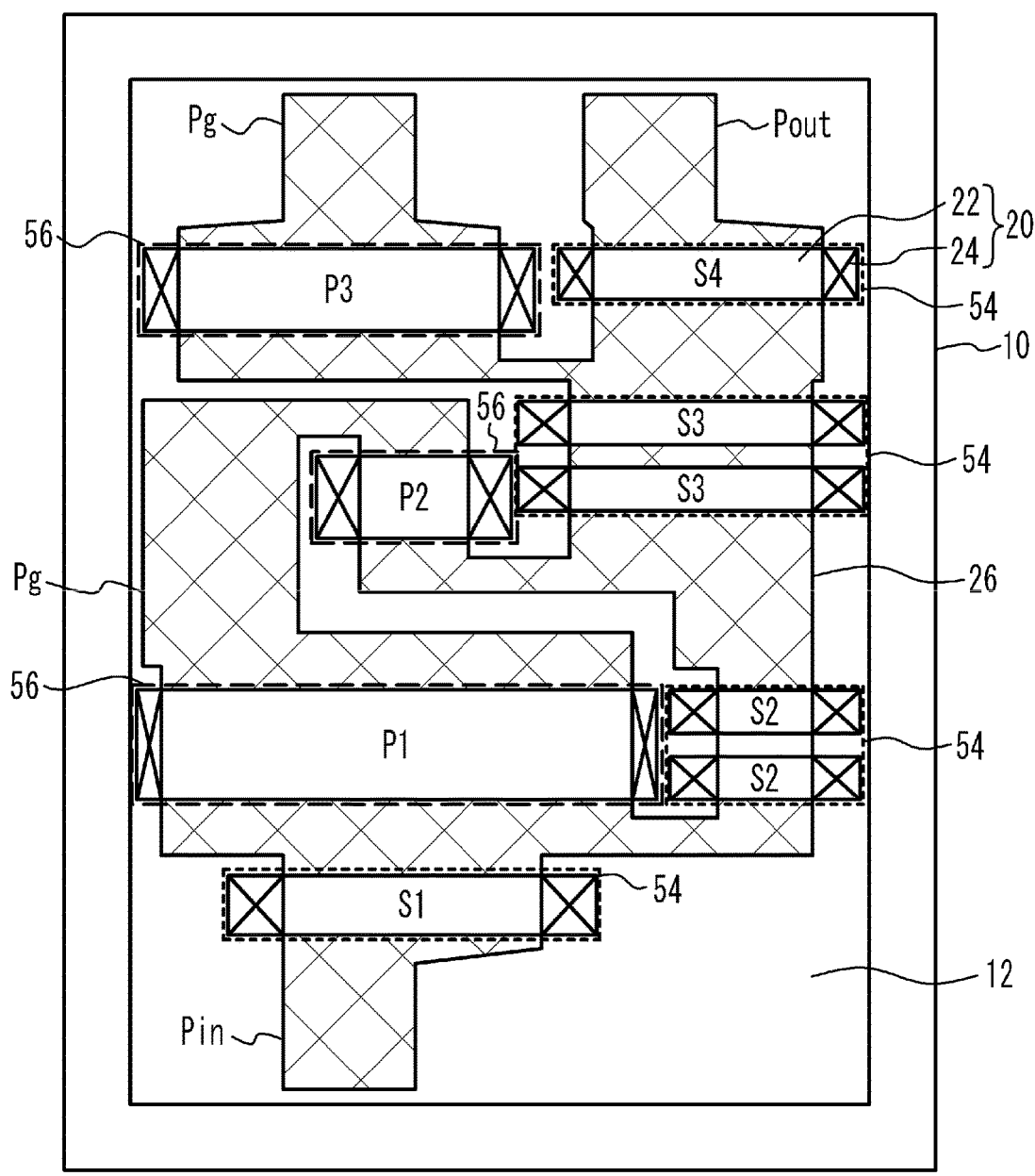
FIG. 5 is a plan view of the ladder-type filter in accordance with the first embodiment.

FIG. 5 is a plan view of the ladder-type filter in accordance with the first embodiment. As illustrated in FIG. 5, acoustic wave resonators 20 and wiring lines 26 are disposed on the piezoelectric substrate 12. The acoustic wave resonators 20 include the series resonators S1 to S4 and the parallel resonators P1 to P3. The wiring lines 26 include pads Pin, Pout, and Pg. The pads Pin, Pout, and Pg are electrically connected to the input terminal Tin, the output terminal Tout, and the ground terminal Tg, respectively. The series resonators S1 to S4 are connected in series between the pads Pin and Pout through the wiring lines 26, and the parallel resonators P1 to P3 are connected in parallel between the pads Pin and Pout through the wiring lines 26. The series resonators S1 to S4 are disposed in regions 54, and the parallel resonators P1 to P3 are disposed in regions 56.

Figure 6A:
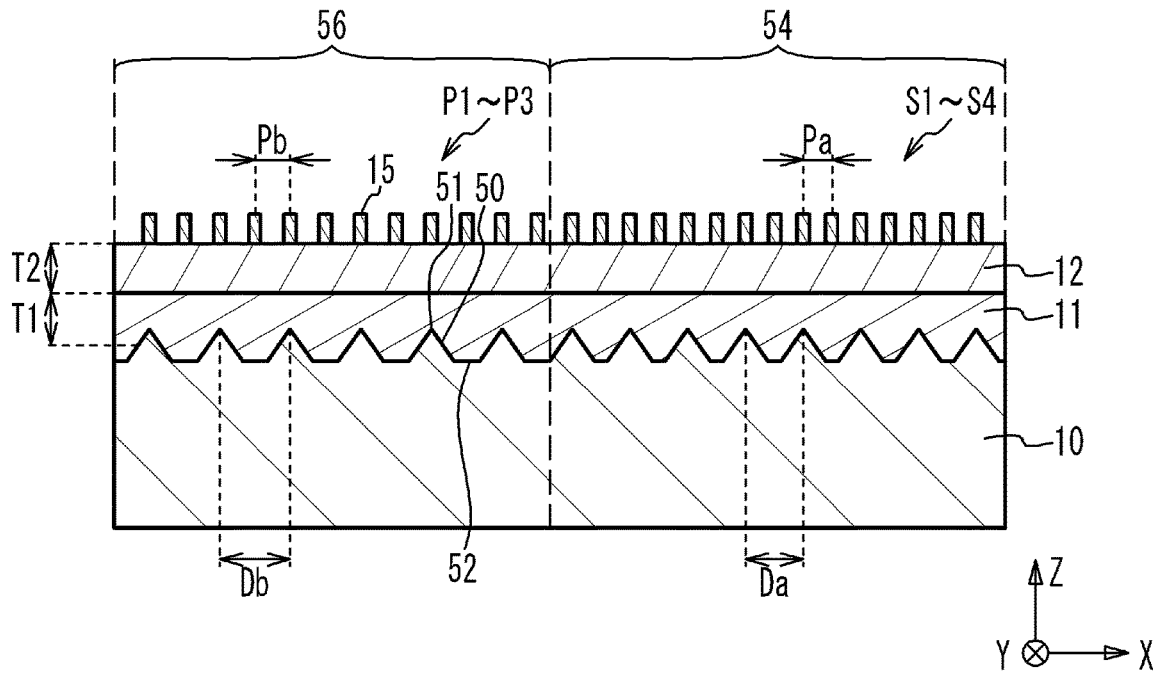
FIG. 6A and FIG. 6B are cross-sectional views of the ladder-type filter in accordance with the first embodiment.
Figure 6B:
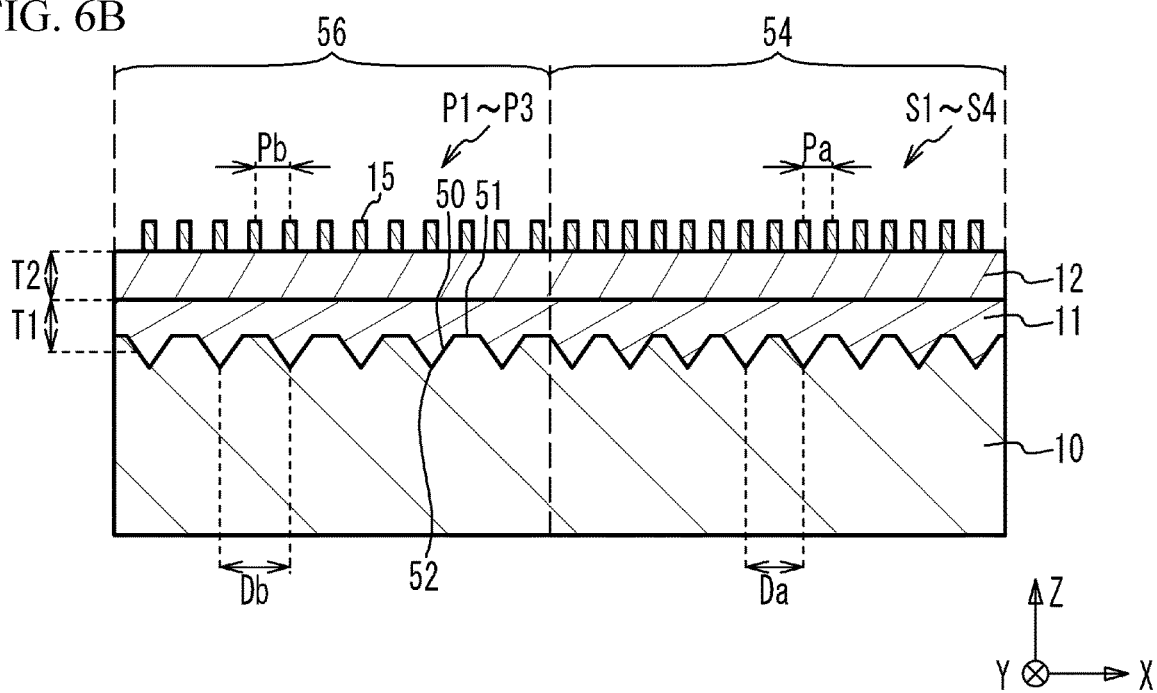

FIG. 6A and FIG. 6B are cross-sectional views of the ladder-type filter in accordance with the first embodiment. As illustrated in FIG. 6A and FIG. 6B, the pitch Pa of the electrode fingers 15 in the series resonators S1 to S4 disposed in the regions 54 is less than the pitch Pb of the electrode fingers 15 in the parallel resonators P1 to P3 disposed in the regions 56. This configuration makes the resonant frequencies of the series resonators S1 to S4 higher than the resonant frequencies of the parallel resonators P1 to P3.

FIG. 6A illustrates an example where the protruding portions 51 are disposed on a plain face as the interface 50. The protruding portion 51 has an apex, and the recessed portion 52 has a plain face. The interval between the protruding portions 51 in the region 54 is represented by Da, and the interval between the protruding portions 51 in the region 56 is represented by Db. FIG. 6B illustrates an example when the recessed portions 52 are disposed on a plain face as the interface 50. The recessed portion 52 has an apex, and the protruding portion 51 has a plain surface. The interval between the recessed portions 52 in the region 54 is represented by Da, and the interval between the recessed portions 52 in the region 56 is represented by Db.

The interval Da between the protruding portions 51 and/or the recessed portions 52 in the region 54 is less than the interval Db between the protruding portions 51 and/or the recessed portions 52 in the region 56. This configuration reduces spurious emissions in the series resonators S1 to S4 and the parallel resonators P1 to P3.

Figure 7:
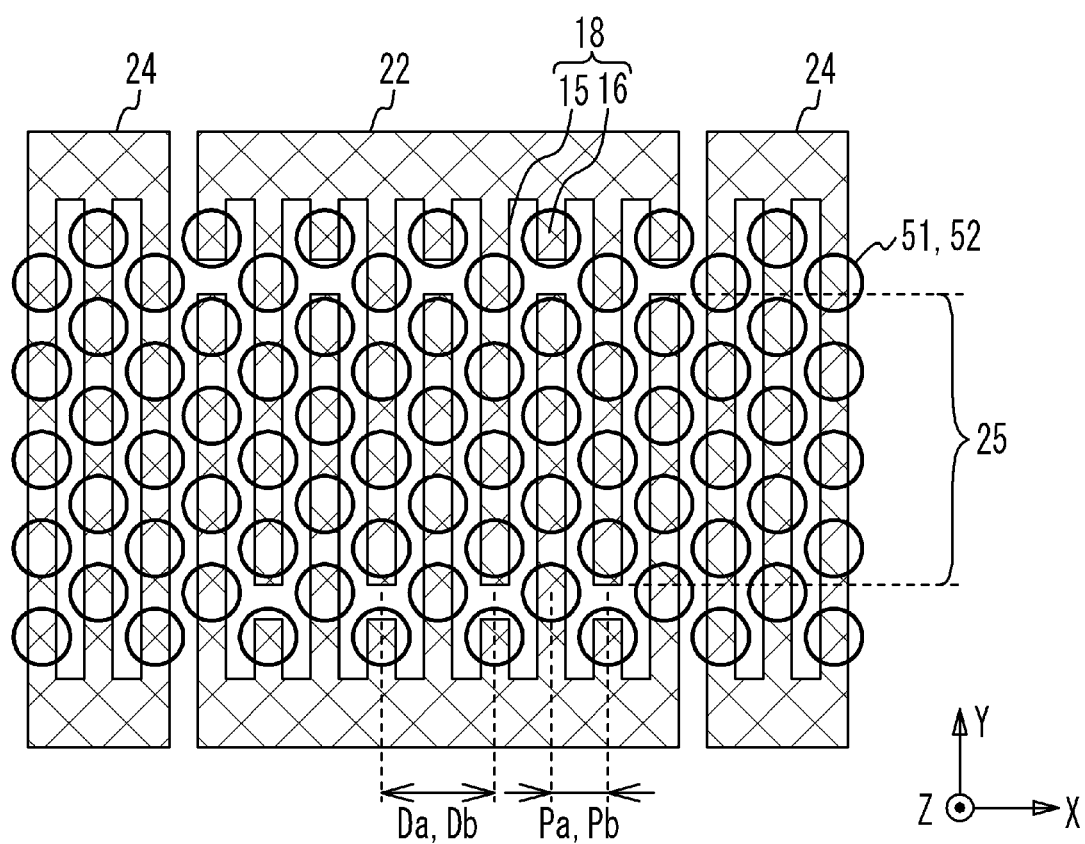
FIG. 7 is a plan view of an acoustic wave resonator in accordance with the first embodiment.

FIG. 7 is a plan view of an acoustic wave resonator in the first embodiment, and illustrates the IDT 22, the reflectors 24, and the protruding portions 51. As illustrated in FIG. 7, the protruding portions 51 and/or the recessed portions 52 are disposed in the overlap region 25 of the IDT 22 and the reflectors 24. The interval Da in the X direction between the protruding portions 51 and/or the recessed portions 52 is approximately two times the pitch Pa in the X direction of the electrode fingers 15, or the interval Db in the X direction between the protruding portions 51 and/or the recessed portions 52 is approximately two times the pitch Pb in the X direction of the electrode fingers 15.

FIG. 8A to FIG. 8M illustrate examples of three-dimensional shapes of the protruding portion and the recessed portion in the first embodiment. FIG. 8A to FIG. 8K are perspective views. When the protruding portion 51 is illustrated, the upper direction is the positive Z direction as indicated by an arrow 56a. When the recessed portion 52 is illustrated, the upper direction is the negative Z direction as indicated by an arrow 56b. FIG. 8L is a plan view, and FIG. 8M is a cross-sectional view. In FIG. 8A to FIG. 8M, the protruding portion 51 and the recessed portion 52 are island-shaped or dot-shaped.

Figure 8A:
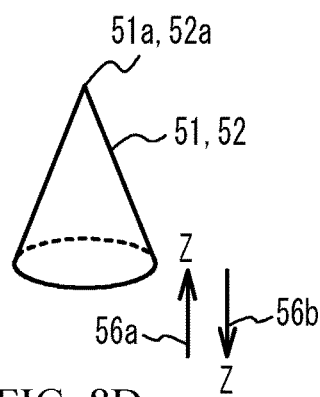
FIG. 8A to FIG. 8M illustrate examples of three-dimensional shapes of a protruding portion and a recessed portion in the first embodiment.
Figure 8B:
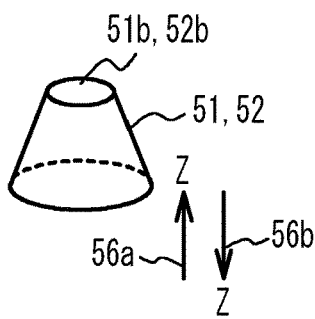
Figure 8C:
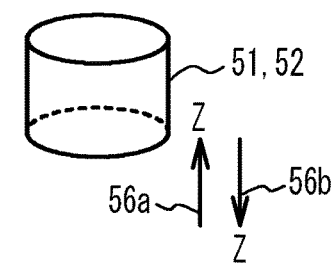

As illustrated in FIG. 8A, the protruding portion 51 has a cone shape having an apex 51a and the recessed portion 52 has a cone shape having an apex 52a. As illustrated in FIG. 8B, the protruding portion 51 has a circular truncated cone shape having an upper surface 51b, and the recessed portion 52 has a circular truncated cone shape having a lower surface 52b. As illustrated in FIG. 8C, the protruding portion 51 and the recessed portion 52 have a circular cylindrical shape.

Figure 8D:
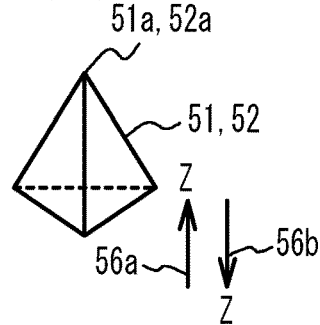
Figure 8E:
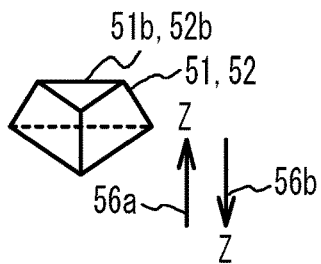
Figure 8F:
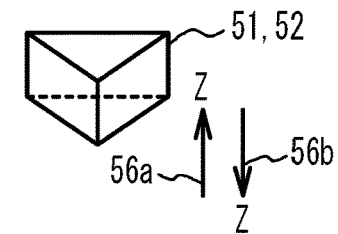

As illustrated in FIG. 8D, the protruding portion 51 has a trigonal pyramid shape having the apex 51a, and the recessed portion 52 has a trigonal pyramid shape having the apex 52a. As illustrated in FIG. 8E, the protruding portion 51 has a truncated trigonal pyramid shape having the upper surface 51b, and the recessed portion 52 has a truncated trigonal pyramid shape having the lower surface 52b. As illustrated in FIG. 8F, the protruding portion 51 and the recessed portion 52 have a triangular prism shape.

Figure 8G:
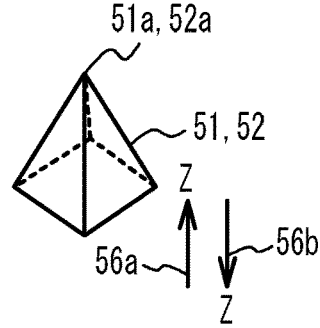
Figure 8H:
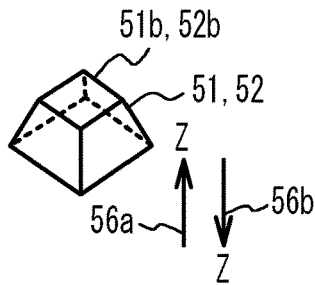
Figure 8I:
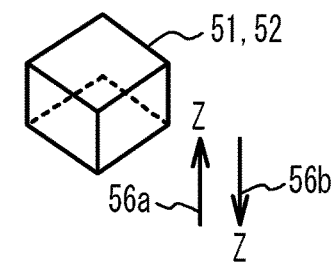

As illustrated in FIG. 8G, the protruding portion 51 has a quadrangular pyramid shape having the apex 51a, and the recessed portion 52 has a quadrangular pyramid shape having the apex 52a. As illustrated in FIG. 8H, the protruding portion 51 has a truncated quadrangular pyramid shape having the upper surface 51b, and the recessed portion 52 has a truncated quadrangular pyramid shape having the lower surface 52b. As illustrated in FIG. 8I, the protruding portion 51 and the recessed portion 52 have a quadrangular prism shape. As described above, the three-dimensional shapes of the protruding portion 51 and the recessed portion 52 may be a cone shape, a polygonal pyramid shape, a truncated cone shape, a truncated polygonal pyramid shape, a cylindrical shape, or a prism shape.

Figure 8J:
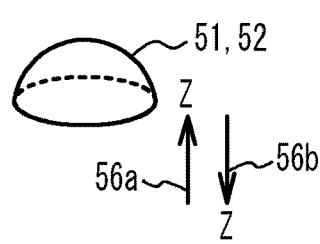
Figure 8K:
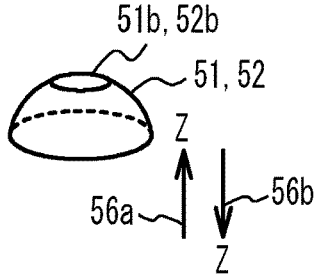
Figure 8L:
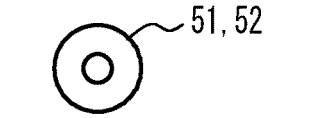
Figure 8M:
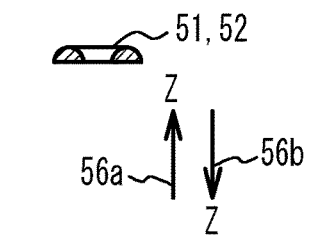

As illustrated in FIG. 8J, the protruding portion 51 and the recessed portion 52 have a hemispheric shape. As illustrated in FIG. 8K, the protruding portion 51 has a shape obtained by removing the upper part of the hemisphere along the upper surface 51b, and the recessed portion 52 has a shape obtained by removing the lower part of the hemisphere along the surface 52b. As described above, the three-dimensional shapes of the protruding portion 51 and the recessed portion 52 may be a part of a sphere shape. The three-dimensional shapes of the protruding portion 51 and the recessed portion 52 may be a part of a prolate spheroid shape or a part of a spheroidal shape. As illustrated in FIG. 8L and FIG. 8M, the protruding portion 51 and the recessed portion 52 have a shape formed of a part of a donut shape. As described above, the three-dimensional shapes of the protruding portion 51 and the recessed portion 52 can be desirably set by appropriately setting the planar shape of a mask and the etching condition at the time of forming the protruding portions 51 and the recessed portions 52.

Figure 9A:
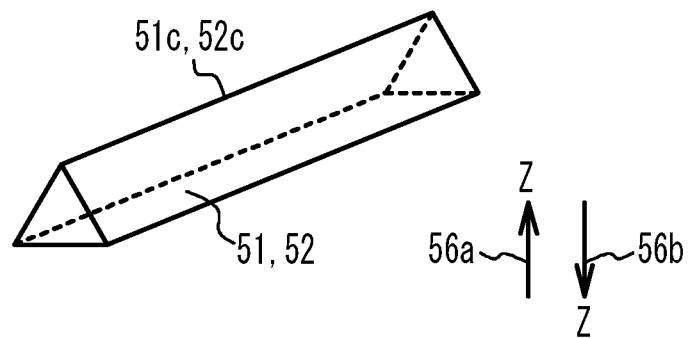
FIG. 9A to FIG. 9C are perspective views illustrating examples of three-dimensional shapes of the protruding portion and the recessed portion in the first embodiment.
Figure 9B:
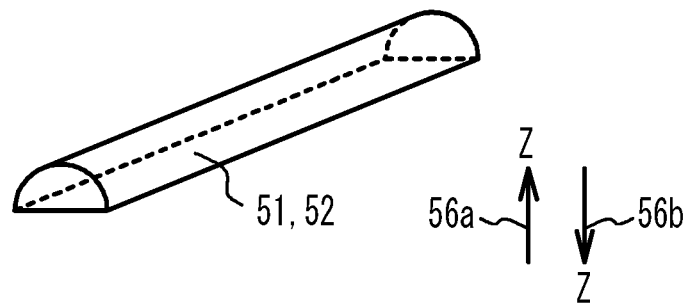
Figure 9C:
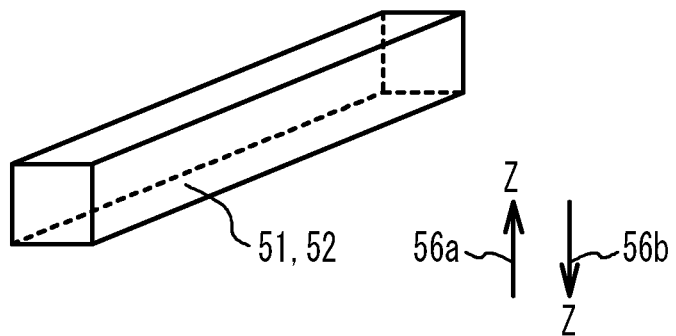

FIG. 9A to FIG. 9C are perspective views of three-dimensional shapes of the protruding portions and the recessed portions in the first embodiment. When the protruding portion 51 is illustrated, the upper direction is the positive Z direction as indicated by the arrow 56a. When the recessed portion 52 is illustrated, the upper direction is the negative Z direction as indicated by the arrow 56b. In FIG. 9A to FIG. 9C, the protruding portions 51 and the recessed portions 52 are line-shaped or stripe-shaped.

As illustrated in FIG. 9A, the protruding portion 51 and the recessed portion 52 may have a line shape having a triangular cross section. Lines 51c and 52c are lines connecting the vertices of the triangles in the protruding portion 51 and the recessed portion 52, respectively. As illustrated in FIG. 9B, the protruding portion 51 and the recessed portion 52 may have a line shape having a semicircular cross section. As illustrated in FIG. 9C, the protruding portion 51 and the recessed portion 52 may have a line shape having a quadrangular cross section. As described above, the protruding portion 51 and the recessed portion 52 may linearly extend, or extend in a curved line.

Examples of the series resonators S1 to S4 and the parallel resonators P1 to P3 are as follows.

Series Resonators S1 to S4:
  Pa×2=5 µm,
  Number of pairs: 100 pairs,
  Aperture length: 25λ,
  Resonant frequency: 840 MHz,
  Da=5 µm,
  H=1.65 µm,
  W=2.7 µm,
  S=2.3 µm.

Parallel Resonators P1 to P3:
  Pb×2=5.5 µm,
  Number of pairs: 80 pairs,
  Aperture length: 30λ,
  Resonant frequency: 800 MHz,
  Db=5.5 µm,
  H=1.65 µm,
  W=2.7 µm,
  S=2.8 µm.

In the first embodiment, the piezoelectric substrate 12 is directly or indirectly bonded on the support substrate 10, and the interface 50 including the protruding portions 51 and/or the recessed portions 52 that are regularly arranged is interposed between the piezoelectric substrate 12 and the support substrate 10. The series resonators S1 to S4 (a first acoustic wave resonator) include a plurality of the electrode fingers 15 (first electrode fingers) having an average pitch of Pa (a first pitch), and the parallel resonators P1 to P3 (a second acoustic wave resonator) include a plurality of the electrode fingers 15 (second electrode fingers) having an average pitch of Pb (a second pitch). Since the pitches Pa and Pb are different, the resonant frequencies of the series resonators S1 to S4 can be made to be different from the resonant frequencies of the parallel resonators P1 to P3.

However, when the pitches Pa and Pb are different as illustrated in FIG. 3A, the interval between the protruding portions 51 and/or the recessed portions 52 most appropriate to reduce spurious emissions in the series resonators S1 to S4 is different from the interval between the protruding portions 51 and/or the recessed portions 52 most appropriate to reduce spurious emissions in the parallel resonators P1 to P3. Thus, the average interval in the X direction between the protruding portions 51 and/or the recessed portions 52 is made to be Da (a first interval) in the region 54 (a first region), whereas the average interval in the X direction between the protruding portions 51 and/or the recessed portions 52 is made to be Db (a second interval) different from Da in the region 56 (a second region). This configuration optimizes spurious emissions of the series resonators S1 to S4 and the parallel resonators P1 to P3.

In the first embodiment, the series resonators S1 to S4 are described as an example of the first acoustic wave resonator and the parallel resonators P1 to P3 are described as an example of the second acoustic wave resonator. However, it is sufficient if the average pitch Pa in the first acoustic wave resonator is different from the average pitch Pb in the second acoustic wave resonator. FIG. 3A merely illustrates an example, and it is sufficient if the average intervals Da and Db most appropriate to reduce spurious emissions are different from each other when the average pitches Pa and Pb are different from each other.

In FIG. 7, the protruding portions 51 and/or the recessed portions 52 are regularly arranged in the X direction, but it is sufficient if the direction in which the protruding portions 51 and/or the recessed portions 52 are regularly arranged is substantially parallel to the X direction. The direction in which the protruding portions 51 and/or the recessed portions 52 are regularly arranged is substantially parallel to the X direction to the extent that spurious emissions can be reduced, and may be inclined by, for example, 20° or less or by 10° or less. In this case, the interval in the X direction between the protruding portions 51 and/or the recessed portions 52 is the interval obtained by projecting the interval in the direction in which the protruding portions 51 and/or the recessed portions 52 are regularly arranged to the X direction.

The average pitches Pa and Pb are calculated by dividing the width in the X direction of the IDT 22 by the number of the electrode fingers 15. The average intervals Da and Db are calculated by dividing the width in the X direction of the IDT 22 by the number of the protruding portions 51 and/or the recessed portions 52 in the X direction.

When the average pitch Pa is less than the average pitch Pb, the average interval Da is made to be less than the average interval Db. This configuration further reduces spurious emissions.

The average interval Da is equal to or greater than 1.2 times the average pitch Pa and equal to or less than 2.8 times the average pitch Pa, whereas the average interval Db is equal to or greater than 1.2 times the average pitch Pb and equal to or less than 2.8 times the average pitch Pb. This configuration further reduces spurious emissions.

The height H of the protruding portion 51 and/or the depth of the recessed portion 52 in the region 54 is equal to or greater than 0.2 times the average pitch Pa, whereas the height H of the protruding portion 51 and/or the depth of the recessed portion 52 in the region 56 is equal to or greater than 0.2 times the average pitch Pb. This configuration further reduces spurious emissions.

The insulating layer 11 is interposed between the support substrate 10 and the piezoelectric substrate 12, and the surface including the protruding portions 51 and/or the recessed portions 52 is the interface 50 between the support substrate 10 and the insulating layer 11. This structure further reduces spurious emissions. An additional film on which the protruding portions 51 are to be formed may be interposed between the support substrate 10 and the insulating layer 11, and the interface 50 may be an interface between the additional film and the support substrate 10 and the insulating layer 11. The support substrate 10 and the piezoelectric substrate 12 may be directly bonded to each other, and at least one of the protruding portion 51 and the recessed portion 52 may be formed on the interface between the support substrate 10 and the piezoelectric substrate 12.

The temperature coefficient of the elastic constant of the insulating layer 11 is opposite in sign to the temperature coefficient of the elastic constant of the piezoelectric substrate 12. This configuration achieves the small temperature coefficient of frequency of the acoustic wave resonator.

Most of the energy of the acoustic wave excited by the electrode fingers 15 is dispersed in the region from the upper surface to the depth less than 2λ of the piezoelectric substrate 12. Thus, the average distance T1+T2 between the surface of the piezoelectric substrate 12 on which the electrode fingers 15 are disposed and the interface 50 in the region 54 is preferably equal to or less than four times the average pitch Pa, and the average distance T1+T2 between the surface of the piezoelectric substrate 12 on which the electrode fingers 15 are disposed and the interface 50 in the region 56 is preferably equal to or less than four times the average pitches Pb. This configuration further reduces spurious emissions. The average distances T1+T2 in the regions 54 and 56 are more preferably equal to or less than three times the average pitches Pa and Pb, respectively, further preferably equal to or less than two times the average pitches Pa and Pb, respectively. When the average distance T1+T2 is too small, the energy of the acoustic wave existing in the piezoelectric substrate 12 and the insulating layer 11 becomes small. Thus, the average distances T1+T2 in the regions 54 and 56 are preferably equal to or greater than 0.2 times the average pitches Pa and Pb, respectively, more preferably equal to or greater than 0.5 times the average pitches Pa and Pb, respectively.

The thickness T2 of the piezoelectric substrate 12 in the region 54 is preferably less than 2 times the average pitch Pa, more preferably equal to or less than 1.6 times the average pitch Pa. The thickness T2 of the piezoelectric substrate 12 in the region 56 is preferably less than 2 times the average pitch Pb, more preferably equal to or less than 1.6 times the average pitch Pb. The thickness T2 of the piezoelectric substrate 12 in the region 54 is preferably equal to or greater than 0.2 times the average pitch Pa, more preferably equal to or greater than 0.4 times the average pitch Pa. The thickness T2 of the piezoelectric substrate 12 in the region 56 is preferably equal to or greater than 0.2 times the average pitch Pb, more preferably equal to or greater than 0.4 times the average pitch Pb. This configuration appropriately distributes the energy of the acoustic wave in the piezoelectric substrate 12.

When the IDT 22 excites a shear horizontal (SH) wave, a bulk wave is likely to be generated. When the piezoelectric substrate 12 is a 36° or greater and 48° or less rotated Y-cut lithium tantalate substrate, the SH wave is excited. In this case, when the thickness T2 of the piezoelectric substrate 12 is less than two times the average pitch Pa, the loss is reduced. Additionally, when the average distances T1+T2 in the regions 54 and 56 are equal to or less than four times the average pitches Pa and Pb, respectively, the loss is reduced.

To inhibit the acoustic wave from leaking to the support substrate 10, the acoustic impedance of the support substrate 10 is preferably higher than the acoustic impedance of the piezoelectric substrate 12 (i.e., the acoustic velocity of the support substrate 10 is preferably greater than the acoustic velocity of the piezoelectric substrate 12). Additionally, since the acoustic wave propagates through the insulating layer 11, the acoustic impedance of the insulating layer 11 is preferably less than the acoustic impedance of the piezoelectric substrate 12 and the acoustic impedance of the support substrate 10 (i.e., the acoustic velocity of the insulating layer 11 is preferably less than the acoustic velocities of the piezoelectric substrate 12 and the support substrate 10).

Second Embodiment

Figure 10:
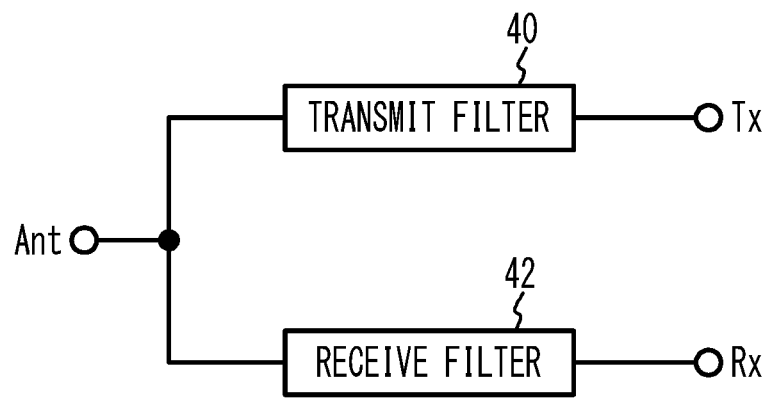
FIG. 10 is a circuit diagram of a duplexer in accordance with a second embodiment.

FIG. 10 is a circuit diagram of a duplexer in accordance with a second embodiment. As illustrated in FIG. 10, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 may be the filter of the first embodiment.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a support substrate;
a piezoelectric substrate directly or indirectly bonded on the support substrate, a surface including protruding portions and/or recessed portions being interposed between the piezoelectric substrate and the support substrate;
a first acoustic wave resonator including first electrode fingers, an average pitch of the first electrode fingers being a first pitch, the first acoustic wave resonator being disposed on the piezoelectric substrate in a first region where an average interval between the protruding portions and/or the recessed portions in a direction in which the first electrode fingers are arranged is a first interval, the protruding portions and/or recessed portions being regularly arranged at first constant intervals in the first region, each of the first constant intervals between the protruding portions and/or between the recessed portions being substantially uniform; and
a second acoustic wave resonator including second electrode fingers, an average pitch of the second electrode fingers being a second pitch; the second pitch being different from the first pitch, the second acoustic wave resonator being disposed on the piezoelectric substrate in a second region where an average interval between the protruding portions and/or the recessed portions in a direction in which the second electrode fingers are arranged is a second interval, the protruding portions and/or recessed portions being regularly arranged at second constant intervals in the second region, each of the second constant intervals between the protruding portions and/or between the recessed portions being substantially uniform, the second interval being different from the first interval.

2. The acoustic wave device according to claim 1; wherein
the first pitch is less than the second pitch, and the first interval is less than the second interval.

3. The acoustic wave device according to claim 1, wherein
the first interval is equal to or greater than 1.2 times the first pitch and equal to or less than 2.8 times the first pitch, and
the second interval is equal to or greater than 1.2 times the second pitch and equal to or less than 2.8 times the second pitch.

4. The acoustic wave device according to claim 1, wherein
heights of the protruding portions and/or depths of the recessed portions in the first region are equal to or greater than 0.2 times the first pitch, and
heights of the protruding portions and/or depths of the recessed portions in the second region are equal to or greater than 0.2 times the second pitch.

5. The acoustic wave device according to claim 1, further comprising:
an insulating layer between the support substrate and the piezoelectric substrate, wherein
the surface is an interface between the support substrate and the insulating layer.

6. The acoustic wave device according to claim 5, wherein
a temperature coefficient of an elastic constant of the insulating layer is opposite in sign to a temperature coefficient of an elastic constant of the piezoelectric substrate.

7. The acoustic wave device according to claim 5, wherein
an average distance between a surface, on which the first electrode fingers are disposed, of the piezoelectric substrate and the surface in the first region is less than four times the first pitch, and an average distance between a surface, on which the second electrode fingers are disposed, of the piezoelectric substrate and the surface in the second region is less than four times the second pitch.

8. A filter comprising:
the acoustic wave device according to claim 1.

9. A filter comprising:
the acoustic wave device according to claim 2,
wherein the first acoustic wave resonator is a series resonator connected in series between a first terminal and a second terminal, and
the second acoustic wave resonator is a parallel resonator connected in parallel between the first terminal and the second terminal.

10. A multiplexer comprising:
the filter according to claim 8.

11. A multiplexer comprising:
the filter according to claim 9.

* * * * *